(12) United States Patent
Harder

(10) Patent No.: US 12,557,397 B2
(45) Date of Patent: *Feb. 17, 2026

(54) SURFACE TREATMENT OF SOLAR CELLS

(71) Applicant: Maxeon Solar Pte. Ltd., Singapore (SG)

(72) Inventor: Nils-Peter Harder, San Jose, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 958 days.

This patent is subject to a terminal disclaimer.

(21) Appl. No.: 17/589,665

(22) Filed: Jan. 31, 2022

(65) Prior Publication Data

US 2022/0158018 A1    May 19, 2022

Related U.S. Application Data

(62) Division of application No. 16/344,176, filed as application No. PCT/IB2017/001424 on Oct. 17, 2017, now Pat. No. 11,271,129.

(60) Provisional application No. 62/417,223, filed on Nov. 3, 2016.

(51) Int. Cl.
*H10F 10/166* (2025.01)
*H10F 10/165* (2025.01)
*H10F 77/20* (2025.01)

(52) U.S. Cl.
CPC ......... *H10F 10/166* (2025.01); *H10F 10/165* (2025.01); *H10F 77/227* (2025.01); *Y02E 10/50* (2013.01)

(58) Field of Classification Search
CPC ......... H01L 31/0747; H01L 31/022458; H01L 31/0745; Y02E 10/50; H10F 10/166; H10F 10/165; H10F 77/227; H10F 77/311; H10F 71/00; H10F 77/703
See application file for complete search history.

(56) References Cited

U.S. PATENT DOCUMENTS

| 8,900,915 B2 | 12/2014 | Rockenberger et al. |
| 2002/0192885 A1 | 12/2002 | Miyasaka |

(Continued)

FOREIGN PATENT DOCUMENTS

| CN | 102347223 A | 2/2012 |
| CN | 104 022 188 | 9/2014 |

(Continued)

OTHER PUBLICATIONS

First Office Action from Chinese Patent Application No. 2017800682144 dated Jul. 5, 2022, 10 pgs. Notice of Preliminary Rejection from Korean Patent Application No. 10-2019-7012857 dated Aug. 22, 2022, 3 pgs.

(Continued)

*Primary Examiner* — Latanya N Crawford Eason
(74) *Attorney, Agent, or Firm* — Schwabe, Williamson & Wyatt, P.C.

(57) ABSTRACT

Methods of fabricating emitter regions of solar cells using surface treatments, and the resulting solar cells, are described herein. In an example, a method of fabricating a solar cell includes treating a surface of a silicon substrate to form a lyophilic area between two lyophobic areas and depositing a liquid phase material containing a silicon material in the lyophilic area to form an emitter region.

14 Claims, 3 Drawing Sheets

(56) References Cited

U.S. PATENT DOCUMENTS

| | | | | |
|---|---|---|---|---|
| 2009/0317934 | A1* | 12/2009 | Scherff | H10F 10/146 |
| | | | | 257/E21.585 |
| 2011/0240997 | A1 | 10/2011 | Rockenberger et al. | |
| 2011/0272011 | A1* | 11/2011 | Lochtefeld | H10F 71/121 |
| | | | | 136/255 |
| 2012/0205593 | A1 | 8/2012 | Ohya et al. | |
| 2012/0305063 | A1* | 12/2012 | Moslehi | H01L 31/0682 |
| | | | | 257/E31.124 |
| 2015/0280018 | A1* | 10/2015 | Rim | H10F 10/146 |
| | | | | 136/258 |
| 2015/0344651 | A1 | 12/2015 | Kondo | |

FOREIGN PATENT DOCUMENTS

| | | |
|---|---|---|
| DE | 10 2011 110171 | 11/2012 |
| DE | 10 2012 202367 | 8/2013 |

OTHER PUBLICATIONS

International Search Report and Written Opinion from PCT/IB2017/001424, mailed Feb. 9, 2018, 13 pgs.

Sheng, et al., "One-step Selective $N^{++}/N^{+}$ Diffusion and BSF Formation for N-type Front-junction Solar Cells," Trinasolar Smart Energy Together, $31^{st}$ European Photovoltaic Solar Energy Conference and Exhibition, Hamburg, Sep. 16, 2015, 12 pgs.

Sheng, et al., "One-step Selective $N^{++}/N^{+}$ Diffusion and BSF Formation for N-type Front-junction Solar Cells," $31^{st}$ European Photovoltaic Solar Energy Conference and Exhibition, 3 pgs.

International Preliminary Report on Patentability from PCT/IB2017/001424 mailed May 16, 2019, 8 pgs.

Non-Final Office Action from U.S. Appl. No. 16/344,176 dated Jun. 15, 2021, 17 pgs.

* cited by examiner

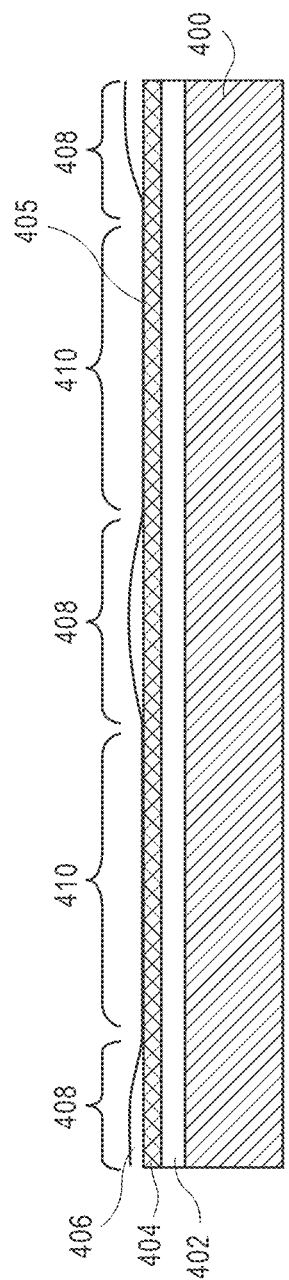
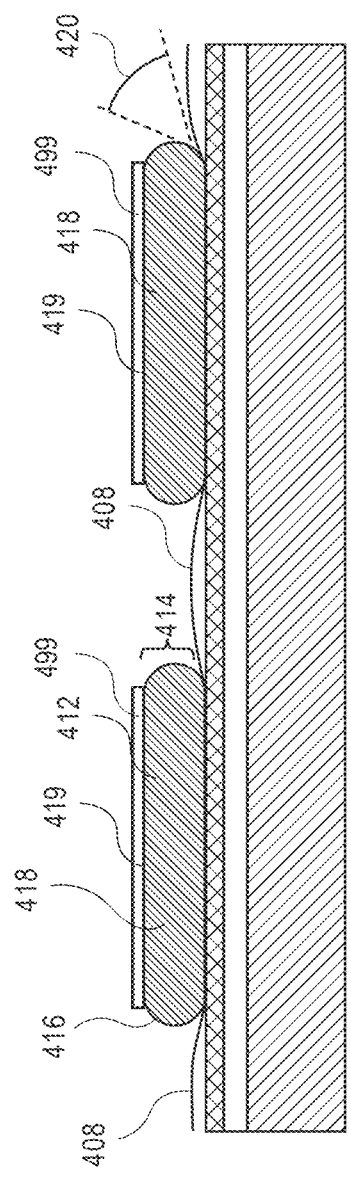
FIG. 4A
FIG. 4B

SURFACE TREATMENT OF SOLAR CELLS

CROSS-REFERENCE TO RELATED APPLICATIONS

This application is a Divisional of U.S. patent application Ser. No. 16/344,176, filed on Apr. 23, 2019, which is a 371 of international PCT/IB2017/001424, filed on Oct. 17, 2017, which claims benefit of U.S. Provisional Application No. 62/417,223, filed on Nov. 3, 2016.

TECHNICAL FIELD

Embodiments of the present disclosure are in the field of renewable energy and, in particular, forming emitter regions using surface treatment.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

BRIEF DESCRIPTION OF THE DRAWINGS

FIGS. 4A-4B illustrate operations of a method of fabricating a solar cell using surface modification of a wafer substrate to define an emitter region structure.

DETAILED DESCRIPTION

Figure 1:
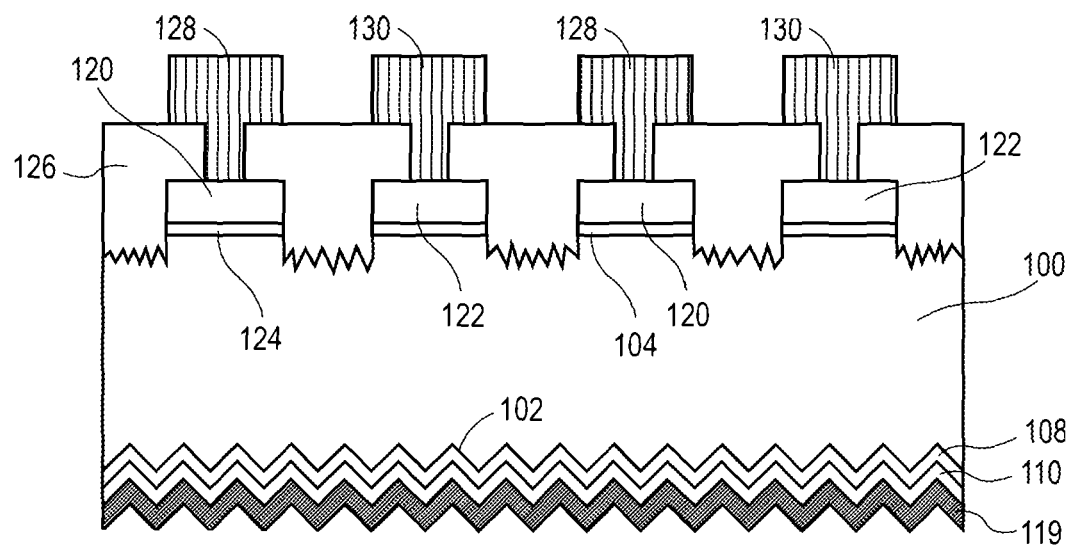
FIG. 1 illustrates a cross-sectional view of a back-contact solar cell having emitter regions formed above a back surface of a substrate.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" lyophobic area does not necessarily imply that this lyophobic area is the first lyophobic area in a sequence; instead the term "first" is used to differentiate this lyophobic area from another lyophobic area (e.g., a "second" lyophobic area).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it can completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper," "lower," "above," and "below" refer to directions in the drawings to which reference is made. Terms such as "front," "back," "rear," "side," "outboard," and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

To provide context, back-contact solar cells include n-type areas for a negative contact and P-type areas for a positive contact, and the areas are accessible at the rear side of the solar cell, i.e., the side that is not directly exposed to incoming sunlight. The n-type areas and P-type area can be interdigitated, and may be referred to as emitter regions or "fingers." Finger structure morphology can influence solar cell function, and accordingly, controllable formation of the finger structure is generally desirable. Formation of the finger structures, however, can be a cumbersome process. Despite challenges in forming the finger structures, however, back-contact solar cells are nevertheless an attractive product, as they offer advantages, for example related to performance and reliability. Accordingly, reductions in the complexity of forming back-contact solar cells, and methods of defining or controlling emitter region structures, is generally desirable.

In one embodiment, a method of fabricating a solar cell includes treating a surface of a silicon substrate to form a lyophilic area between two lyophobic areas. The method can include depositing a liquid phase material, e.g., a silane-type polymer, on the surface in the lyophilic area to form an emitter region between the two lyophobic areas. The emitter region can be a P-type doped region or an N-type doped region.

FIG. 1 illustrates a cross-sectional view of a back-contact solar cell having emitter regions formed above a back surface of a substrate. A solar cell includes a silicon substrate 100 having a light-receiving surface 102. A passivating dielectric layer 108 can be disposed on the light-receiving surface of the silicon substrate 100. An optional intermediate material layer (or layers) 110 can be disposed on the passivating dielectric layer 108. An anti-reflective coating (ARC) layer 119 can be disposed on the optional intermediate material layer (or layers) 110, as shown, or can be disposed on the passivating dielectric layer 108.

On the back surface of the substrate 100, alternating P-type 120 and N-type 122 emitter regions are formed. In one such embodiment, trenches are disposed between the alternating P-type 120 and N-type 122 emitter regions. More particularly, in an embodiment, first polycrystalline silicon emitter regions 122 are formed on a first portion of a thin dielectric layer 124 and are doped with an N-type impurity. Second polycrystalline silicon emitter regions 120 are formed on a second portion of the thin dielectric layer 124 and are doped with a P-type impurity. In an embodiment the tunnel dielectric 124 is a silicon oxide layer having a thickness of approximately 2 nanometers or less.

Conductive contact structures 128/130 are fabricated by first depositing and patterning an insulating layer 126 to have openings and then forming one or more conductive layers in the openings. The conductive contact structures 128/130 include metal and can be formed by a deposition, lithographic, and etch approach or, alternatively, a printing or plating process or, alternatively, a foil or wire adhesion process.

Figure 2:
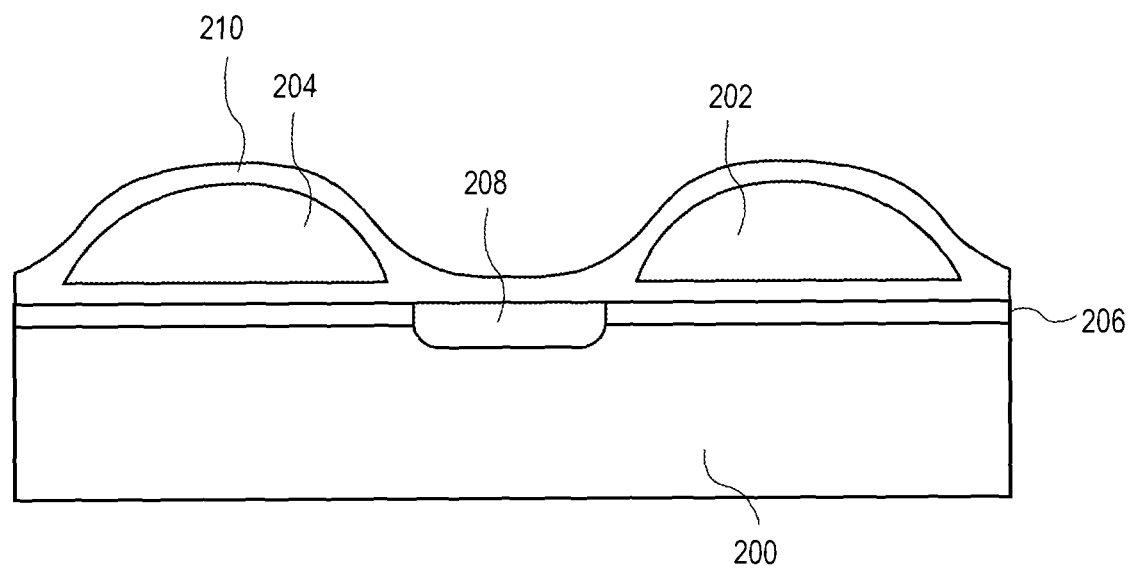
FIG. 2 illustrates a cross-sectional view of N-type and P-type emitter regions of a back-contact solar cell.

Referring to FIG. 2, a cross-sectional view of N-type and P-type emitter regions of a back-contact solar cell are shown. The N-type 202 and P-type 204 fingers, i.e., the emitter regions, can be disposed on a thin tunnel oxide 206 on a wafer 200. The trench region 208 can be doped and extend between the emitter region fingers. For example, the trench region 208 can be doped N-type. An oxide layer 210 can cover the entire structure, which can be primarily a PSG-layer, i.e., a mixture of SiO2 and P2O5.

Figure 3:
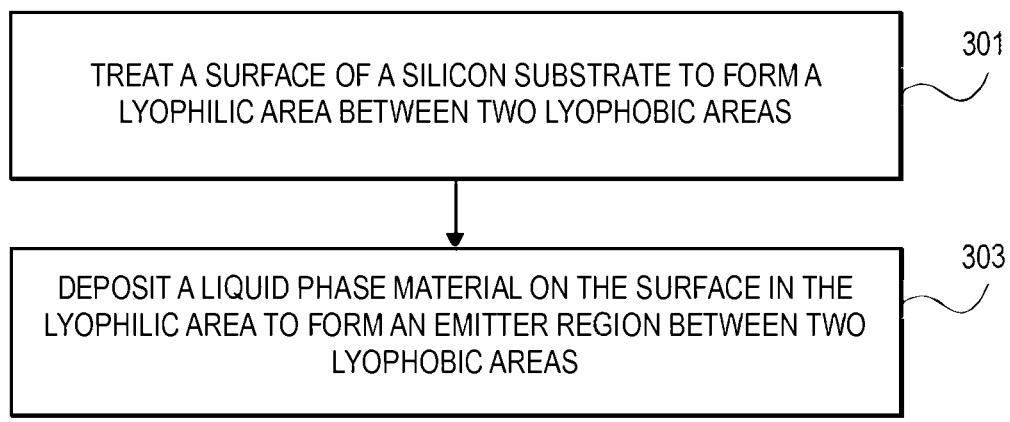
FIG. 3 illustrates a flowchart of a method of fabricating a solar cell using surface modification of a wafer substrate to define an emitter region structure.

Referring to FIG. 3, a flowchart of a method of fabricating a solar cell using surface modification of a wafer substrate to define or control an emitter region structure is shown. FIGS. 4A-4B illustrate operations of a method of fabricating a solar cell, which can be exemplary operations of the method shown in FIG. 3. Thus, the following description refers to FIG. 3 in combination with the operations shown in FIGS. 4A-4B.

In an embodiment, a thin tunnel oxide on a wafer substrate is covered by a thin layer of silicon. The thin layer of silicon can have an exposed surface, e.g., a top surface. The thin layer of silicon may be referred to as a silicon substrate. Patterns of lyophobic areas and/or lyophilic areas can be formed on the silicon substrate prior to deposition of a liquid phase material that forms the emitter region fingers.

By way of introduction, the terms lyophobic and lyophilic are used throughout this description to refer to surface properties of an underlying region of the silicon substrate. An area of the substrate surface is lyophilic when it has wetting surface properties for a particular material, which as described below, can be a liquid phase material used to form emitter regions, e.g., an N-type or P-type emitter region. An area of the substrate surface is lyophobic when it has non-wetting surface properties for the particular liquid phase material. Thus, the terms lyophilic area and lyophobic area make sense in the context of the material that is being deposited onto the areas. This can be compared and contrasted with the terms "hydrophilic" and "hydrophobic," which presume that the deposited material is water. That is, a hydrophilic area can have wetting surface properties for water, but can nonetheless be lyophobic to a different material of interest. For example, an oxide layer can be hydrophilic in that it has wetting surface properties for water, but has non-wetting surface properties for a liquid phase material containing a silicon material. Therefore, it will be understood that the formation of lyophobic and lyophilic areas as described below can be achieved using different processes that modify the silicon substrate surface to have wetting or non-wetting surface properties for a given material, which can be different than silicon in an embodiment.

At operation 301, the exposed surface of the silicon substrate is treated to form a lyophilic area between two lyophobic areas. For example, the exposed surface of the silicon substrate can originally be lyophilic, and a first lyophobic area and a second lyophobic area can be formed by modifying the exposed silicon surface in a manner that causes those areas to become lyophobic. The first lyophobic area can be laterally separated from the second lyophobic area. The untreated areas between the first and second lyophobic area can be the lyophilic area.

In an alternative embodiment, the substrate material, e.g., the silicon substrate, can originally be lyophobic, and the lyophilic area can be formed by modifying the substrate material. More particularly, the exposed silicon surface can be modified in a manner that causes the treated area to become lyophilic. The newly formed lyophilic area can laterally separate the first lyophobic area from the second lyophobic area.

Referring to FIG. 4A, in an embodiment, treating the surface 405 of the silicon substrate 404 (which may be a silicon layer 404 on an oxide layer 402 on an underlying substrate or wafer 400, as depicted, or may be a surface of a bulk monocrystalline silicon substrate), includes forming an oxide layer 406 on the silicon substrate to form the two or more lyophobic areas 408. Forming the oxide layer 406 can include hydrogenating all or part of the silicon substrate surface, and then locally oxidizing regions of the hydrogenated surface to form the lyophobic area.

Hydrogenating the silicon substrate surface can include terminating the exposed lyophilic surface 410 of the silicon substrate with hydrogen. For example, the surface can be exposed to a hydrogen-terminating agent, such as hydrofluoric acid, which terminates the silicon surface of the substrate with hydrogen. Alternatively, the silicon surface can be exposed to a hydrogen-plasma to generate hydrogen-terminated surfaces.

Forming the oxide layer 406 can also include exposing the hydrogen-terminated surface to an oxygen-containing atmosphere, and locally stimulating oxidation by energy supply such as from UV-radiation or laser irradiation. The oxide layer can be lyophobic to a deposition material of interest, e.g., a liquid phase material that forms the emitter finger region, as discussed below. Thus, forming the oxide layer can modify the originally lyophilic substrate surface such that the treated areas become lyophobic to form the two lyophobic areas.

The hydrogen-terminated surface of the silicon substrate can be oxidized by locally exposing the surface of the silicon substrate to energy in an oxygen-containing atmosphere. The energy can include energy from ultraviolet (UV) radiation, laser, or plasma.

In an embodiment, the treated areas that are transformed into lyophobic areas are illuminated with a laser in air or in oxygen. Laser illumination can be applied in patterns, e.g., by scanning a laser beam over areas where the lyophilic condition of the treated areas is to be turned into a lyophobic condition. The local illumination can form a thin oxide layer to provide the lyophobic properties to the treated areas.

In an embodiment, the treated areas are illuminated with UV radiation in an air or oxygen-containing atmosphere. UV illumination can be applied in a desired pattern using suitable optics. Alternatively, a shadow mask can be used to control exposure of the silicon surface to the UV radiation. The shadow mask can be laid directly on the silicon substrate surface, and thus, the UV radiation can be limited to the areas where the lyophilic condition of the treated areas is to be turned into a lyophobic condition. The local illumination can form a thin oxide layer to provide the lyophobic properties to the treated areas.

In an embodiment, the oxygen-containing atmosphere is a general ozone environment. A mask can be placed onto the silicon substrate surface prior to exposing the wafer to the general ozone environment. The wafer can then be exposed to the general ozone environment. The mask can shield underlying areas of the silicon substrate surface from the general ozone environment, and the unmasked areas can be oxidized by the general ozone environment to form a thin oxide layer to provide the lyophobic properties to the treated areas.

In an embodiment, the treated areas are exposed to an oxygen plasma. Atmospheric plasma treatments can be less capital expenditure-intensive, e.g., as compared to vacuum processing. Atmospheric plasma treatments can change wetting behavior of surfaces and can be controlled to achieve a desired lyophilic/lyophobic condition of the treated areas. A desired pattern can be formed using a shadow mask. The shadow mask can be laid directly on the silicon substrate surface, and thus, the plasma treatment can be limited to the areas where the lyophilic condition of the treated areas is to be turned into a lyophobic condition.

The treatment options discussed above, i.e., UV radiation exposure, laser exposure, or plasma exposure (in which the plasma exposure can include, e.g., an oxygen plasma, an N2O plasma, or an inert gas plasma), can accelerate oxide formation on silicon. More particularly, the treatment options can generate lyophobic silicon surfaces by modifying hydrogen-terminated surfaces of a lyophilic silicon surface. The exposure can be minimal. That is, exposure can be limited to an amount of exposure required to achieve a desired change to surface properties, regardless of a resulting oxide thickness. The exposure of the hydrogen-terminated surface to oxidizing conditions can generate a thin layer of oxide. For example, one or more of the lyophobic area can include an oxide layer having one or more monolayers of oxide to generate a lyophobic surface. In an embodiment, the oxide layer has fewer than ten monolayers of oxide. Accordingly, the oxide layer can turn the lyophilic condition of the treated areas into a lyophobic condition.

To clarify again, although an embodiment is presented above in which an originally lyophilic surface is modified to form two lyophobic surface areas, in another embodiment, an originally lyophobic surface is modified to form a lyophilic surface area between two originally lyophobic areas. In any case, after treating the substrate surface, the surface have a pattern including a lyophilic area between two lyophobic areas. Furthermore, although this description has been limited to a portion of the substrate surface having a single lyophilic area between two lyophobic areas, it will be appreciated that the method can be scaled to form a larger pattern having several lyophilic areas between respective groupings of two lyophobic areas. For example, the modified surface of the silicon substrate can include a sequential arrangement of lyophilic areas separated from each other by a single lyophobic area, and lyophobic areas separated from each other by a single lyophilic area.

The different pattern areas of the surface, i.e., the lyophilic area between the lyophobic areas, can have different surface conditions. That is, the lyophilic areas can be lyophilic to a material of interest, and the lyophobic areas can be lyophobic to the material of interest. This difference in surface conditions can define stopping areas where a material deposited in a liquid phase does not enter. Thus, patterned areas can control and define a structure of a deposited material as described below.

At operation 303, a liquid phase material can be deposited on the surface in the lyophilic area to form an emitter region between the two lyophobic areas. The liquid phase material used to form an emitter region can be a liquid phase material containing silicon. For example, the liquid phase material may include a silane-type polymer dispensed in a solvent. Alternatively, the liquid phase material may include silicon nanoparticles dispensed in a solvent. Accordingly, the liquid phase material may include any liquid phase material including a silicon material that can be deposited as a pre-cursor for forming a silicon layer. In an embodiment, the deposited liquid phase material can be high-temperature annealed, e.g., at a temperature below 1400 degrees Celsius, to form a silicon finger morphology.

In an embodiment, the liquid phase material may not include the actual silicon that forms an emitter region finger, however, the liquid phase material can nonetheless include dopants. More particularly, the emitter region finger can be formed by dispensing the liquid phase material onto the silicon substrate, and dopants contained within the liquid phase material may diffuse into the silicon substrate to form the emitter region fingers in the silicon substrate.

Referring to FIG. 4B, an amount of the liquid phase material 412 can be deposited in the lyophilic regions 410 between the first lyophobic area and the second lyophobic area 408.

As material is deposited into the lyophilic area between the lyophobic areas, the edges of the material can eventually contact the lyophobic areas, causing a shape of the deposited material edges 414 to change. That is, the deposited material, e.g., silicon dispensed in solvent, can spread over the entire lyophilic area in some cases. When an amount of deposited material is greater than an amount necessary to fill the lyophilic area, the deposited material can form a steep contact angle 420 where it borders against the lyophobic areas. The edges of the material deposited into the lyophilic area can be thin and knife-like as the material spreads within the lyophilic area, but upon contacting the lyophobic area, the lateral spreading of the material can stop and the material edges can thicken. The liquid phase can be held back by the lyophobic properties of the oxide of the lyophobic areas. Surface tension can laterally constrain the deposited material such that the deposited film has a substantially constant thickness between lateral edges, and each edge is steep. For example, each edge may have a thickness that drops to zero within a lateral distance that is of a similar or smaller magnitude than the film thickness. As one non-limiting example, each edge may have a thickness that drops to zero within a lateral distance no greater than 10 times, e.g., no greater than 1.25 times, the thickness. The lateral distance can be less than the thickness. In an embodiment, each edge 414 includes a convexity 416 that bulges outward from the substrate surface. The deposited material can form an emitter region 418 having a thick edge with an abrupt change of the layer thickness to zero at the edge, as described above.

In a similar manner, using different wetting properties of the deposited silicon fingers and the trench regions in between, it is possible to apply a self-aligned dielectric 499 to a surface of the emitter region fingers, i.e., to surface 419 of emitter region fingers 418. In the envisaged scenario, the dielectric is deposited via a liquid or viscous phase. Deposition can include dipping, ink jetting, or screen printing, to name a few options. The deposited material will, if the wetting properties of the involved surfaces are suitably designed, wet only the intended finger regions and not cover the trench.

The above description provides a pathway for using a promising strategy of a simple production sequence for back-contact solar cells. Local deposition of a liquid phase material containing a silicon material, such as printing a silane-type polymer, can provide a promising strategy for forming emitter regions on a silicon substrate of the solar cells. The described method can form the emitter region structures to include predetermined structural contours, e.g., edges having an abrupt change of thickness down to zero. Furthermore, the emitter region structure defined through the use of patterned areas having different wetting surface properties can provide a pathway for low-cost and simple production of effective back-contact solar cells.

Thus, methods of fabricating solar cells using surface treatment of a wafer substrate to control an emitter region structure, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell fabricated according to a method, the method comprising:
    treating a surface of a silicon substrate to form a lyophilic area between a first lyophobic area and a second lyophobic area;
    subsequent to treating the surface of the silicon substrate to form the lyophilic area, depositing a liquid phase material on the surface in the lyophilic area to form an emitter region between the first lyophobic area and the second lyophobic area, wherein the liquid phase material does not form on the first and second lyophobic areas during the depositing; and
    subsequent to forming the emitter region, forming a self-aligned dielectric on a surface of the emitter region, wherein the self-aligned dielectric forms only on the surface of the emitter region.

2. The solar cell of claim 1, wherein treating the surface to form the first lyophobic area and the second lyophobic area includes forming an oxide layer.

3. The solar cell of claim 2, wherein treating the surface to form the first lyophobic area and the second lyophobic area includes:
    hydrogenating the surface; and
    exposing the hydrogenated surface to an oxygen-containing atmosphere.

4. The solar cell of claim 2, wherein forming the oxide layer comprises using oxidation by energy supplied from UV-radiation or laser irradiation.

5. The solar cell of claim 1, wherein the liquid phase material includes one or more of a silane polymer or silicon nano-particles.

6. The solar cell of claim 1, wherein the surface of the silicon substrate is a surface of a silicon layer on a silicon oxide layer on a silicon wafer.

7. The solar cell of claim 1, wherein the surface of the silicon substrate is a surface of a monocrystalline silicon substrate.

8. A solar cell fabricated according to a method, the method comprising:
    treating a lyophilic surface of a silicon substrate to provide a lyophilic area between a first lyophobic area and a second lyophobic area;
    subsequent to treating the surface of the silicon substrate to form the lyophilic area, depositing a liquid phase material on the surface in the lyophilic area to form an emitter region between the first lyophobic area and the second lyophobic area, wherein the liquid phase material does not form on the first and second lyophobic areas during the depositing; and
    subsequent to forming the emitter region, forming a self-aligned dielectric on a surface of the emitter region, wherein the self-aligned dielectric forms only on the surface of the emitter region.

9. The solar cell of claim 8, wherein treating the lyophilic surface to form the first lyophobic area and the second lyophobic area includes forming an oxide layer.

10. The solar cell of claim 9, wherein treating the lyophilic surface to form the first lyophobic area and the second lyophobic area includes:
   hydrogenating the lyophilic surface; and
   exposing the hydrogenated surface to an oxygen-containing atmosphere.

11. The solar cell of claim 9, wherein forming the oxide layer comprises using oxidation by energy supplied from UV-radiation or laser irradiation.

12. The solar cell of claim 8, wherein the liquid phase material includes one or more of a silane polymer or silicon nano-particles.

13. The solar cell of claim 8, wherein the lyophilic surface of the silicon substrate is a surface of a silicon layer on a silicon oxide layer on a silicon wafer.

14. The solar cell of claim 8, wherein the lyophilic surface of the silicon substrate is a surface of a monocrystalline silicon substrate.

* * * * *